(12) United States Patent
Xu

(10) Patent No.: US 12,341,064 B2
(45) Date of Patent: Jun. 24, 2025

(54) CHIP REDISTRIBUTION STRUCTURE AND PREPARATION METHOD THEREOF

(71) Applicant: CHIPMORE TECHNOLOGY CORPORATION LIMITED, Suzhou (CN)

(72) Inventor: Guanmeng Xu, Suzhou (CN)

(73) Assignee: CHIPMORE TECHNOLOGY CORPORATION LIMITED, Suzhou (CN)

( * ) Notice: Subject to any disclaimer, the term of this patent is extended or adjusted under 35 U.S.C. 154(b) by 197 days.

(21) Appl. No.: 17/622,683

(22) PCT Filed: Nov. 21, 2019

(86) PCT No.: PCT/CN2019/119964
§ 371 (c)(1),
(2) Date: Dec. 23, 2021

(87) PCT Pub. No.: WO2021/036027
PCT Pub. Date: Mar. 4, 2021

(65) Prior Publication Data
US 2022/0254719 A1    Aug. 11, 2022

(30) Foreign Application Priority Data
Aug. 30, 2019 (CN) .......................... 201910811918.7

(51) Int. Cl.
*H01L 21/768* (2006.01)
(52) U.S. Cl.
CPC .................. *H01L 21/76873* (2013.01); *H01L 2224/02373* (2013.01); *H01L 2224/02375* (2013.01); *H01L 2224/0239* (2013.01)

(58) Field of Classification Search
CPC . H01L 2224/02381; H01L 2224/02375; H01L 2224/02373; H01L 2224/0236;
(Continued)

(56) References Cited

U.S. PATENT DOCUMENTS 10,103,107 B1 * 10/2018 Lu ........................... H01L 24/03
2007/0145558 A1    6/2007 Chia et al.
(Continued)

FOREIGN PATENT DOCUMENTS

CN        1717797 A    1/2006
CN        1885524 A    12/2006
(Continued)

*Primary Examiner* — Lauren R Bell
(74) *Attorney, Agent, or Firm* — Cheng-Ju Chiang

(57) ABSTRACT

The present invention provides a chip redistribution structure and a preparation method thereof. The chip redistribution structure includes a chip body, and a first distribution layer and a second distribution layer which are connected to the chip body. A first pin and a second pin are disposed on the surface of the chip body. The chip redistribution structure further includes a dielectric layer disposed on the surface of the chip body, wherein the dielectric layer is recessed downwards to form a first window, a second window, and a groove interconnected with the first window. The first window and the second window respectively correspond to the first pin and the second pin. The first distribution layer extends along the groove and is interconnected with the first pin, and the second distribution layer is disposed above the dielectric layer and is interconnected with the second pin.

12 Claims, 4 Drawing Sheets

(58) Field of Classification Search
CPC ....... H01L 21/76865; H01L 21/76883–76892; H10L 2224/02313; H10L 2224/0233–024
See application file for complete search history.

(56) References Cited

U.S. PATENT DOCUMENTS

| | | | |
|---|---|---|---|
| 2014/0353837 A1 | 12/2014 | Watanabe | |
| 2015/0021758 A1* | 1/2015 | Tsai | H01L 24/11 257/737 |
| 2017/0110403 A1* | 4/2017 | Hwang | H01L 23/3142 |
| 2017/0221838 A1* | 8/2017 | Chen | H01Q 1/38 |
| 2018/0040412 A1* | 2/2018 | Yen | H01F 27/29 |
| 2019/0378827 A1* | 12/2019 | Lin | H01L 21/486 |
| 2020/0144358 A1* | 5/2020 | Koduri | H01L 28/10 |
| 2020/0161264 A1* | 5/2020 | Lin | H01L 24/11 |
| 2021/0028102 A1* | 1/2021 | Yeon | H01L 24/16 |
| 2023/0170131 A1* | 6/2023 | Tang | H01L 23/3107 257/531 |

FOREIGN PATENT DOCUMENTS

| | | |
|---|---|---|
| CN | 101432862 A | 5/2009 |
| CN | 107068669 A | 8/2017 |
| CN | 108346623 A | 7/2018 |
| CN | 109326575 A | 2/2019 |
| CN | 109786340 A | 5/2019 |
| CN | 109844938 A | 6/2019 |
| JP | 2004-22898 A | 1/2004 |
| JP | 2004-140115 A | 5/2004 |
| JP | 2004-140116 A | 5/2004 |
| JP | 2018-93129 A | 6/2018 |

* cited by examiner

CHIP REDISTRIBUTION STRUCTURE AND PREPARATION METHOD THEREOF

TECHNICAL FIELD

The present invention relates to the field of semiconductor manufacturing technologies, and in particular, to a chip redistribution structure and a preparation method thereof.

BACKGROUND

With the continuous development of the semiconductor industry, requirements on the integration density of chips involved in various electronic products have also been increasing. During an encapsulation process, pins made of top metal on the surface of a chip usually need to be redistributed and connected to corresponding conductive bumps with a redistribution layer (RDL). The line size of the RDL itself and a gap between different RDLs cannot be continuously reduced due to the limitation of the actual process capability. That is to say, the distribution density of the RDL on the surface of the chip cannot be improved indefinitely.

In this case, a multi-layer distribution mode is usually adopted in the industry for RDL preparation, that is, a dielectric layer is prepared on the corresponding redistribution layer, and then another redistribution layer is prepared on the dielectric layer. In the above solution, a metal seed layer needs to be prepared above the dielectric layer, and the excess metal seed layer is removed by etching after the corresponding redistribution layer is prepared. As a result, the process is relatively complex.

In view of this, it is necessary to provide a new chip redistribution structure and a preparation method thereof.

SUMMARY

An object of the present invention is to provide a chip redistribution structure and a preparation method thereof, which can overcome the process limitation of a redistribution layer, improve the redistribution density on the surface of a chip and reduce the risk of short circuit.

For achieving the above object, the present invention provides a chip redistribution structure. The chip redistribution structure includes a chip body, and a first distribution layer and a second distribution layer which are connected to the chip body. A first pin and a second pin are disposed on the surface of the chip body. The chip redistribution structure further includes a dielectric layer disposed on the chip body, wherein the dielectric layer is recessed downwards to form a first window, a second window, and a groove interconnected with the first window. The first window and the second window respectively correspond to the first pin and the second pin. The first distribution layer extends along the groove and is interconnected with the first pin, and the second distribution layer is disposed above the dielectric layer and is interconnected with the second pin.

As a further improvement of the present invention, the chip redistribution structure further includes a metal seed layer, on which both the first distribution layer and the second distribution layer are disposed.

As a further improvement of the present invention, the first distribution layer includes a first body portion disposed in the groove, and a first connecting portion connected with the first body portion and located in the first window; and the second distribution layer includes a second body portion disposed on the top surface of the dielectric layer, and a second connecting portion connected with the second body portion and located in the second window.

As a further improvement of the present invention, a top of the first distribution layer does not extend beyond an opening position of the groove.

As a further improvement of the present invention, the first distribution layer and the second distribution layer are made of the same material.

As a further improvement of the present invention, the chip body includes a semiconductor substrate, a line layer formed on the surface of the semiconductor substrate, and a protective layer covering the line layer; and the first pin and the second pin are connected to the line layer.

The present application further provides a preparation method of a chip redistribution structure. The method mainly includes:

providing a chip body, wherein a first pin and a second pin are disposed on the surface of the chip body;

preparing a dielectric layer on the surface of the chip body, wherein the dielectric layer is provided with a first window corresponding to the first pin, a second window corresponding to the second pin, and a groove interconnected with the first window;

coating a first photoresist and performing exposure and development to expose the first window and the groove to the outside, so that a first distribution layer is prepared in the first window and the groove; and coating a second photoresist and performing exposure and development to expose the second window and the top surface of a predetermined region of the dielectric layer to the outside, so that a second distribution layer is prepared in the second window and on the top surface exposed to the outside.

As a further improvement of the present invention, before coating the first photoresist, sputtering is performed on the top surface of the dielectric layer and in the first window, the second window and the groove to obtain a metal seed layer, on which both the first distribution layer and the second distribution layer are disposed.

As a further improvement of the present invention, after coating the first photoresist, exposure and development are performed, so that the second window, the first window and the groove are all exposed to the outside.

As a further improvement of the present invention, both the first distribution layer and the second distribution layer are prepared with an electroplating process.

The present invention has the beneficial effects as follows. In the chip redistribution structure and the preparation method thereof according to the present invention, the dielectric layer is disposed on the chip body, the groove is formed in the dielectric layer, and the first distribution layer and the second distribution layer are respectively disposed in the groove and on the top surface of the dielectric layer. That is, the first distribution layer and the second distribution layer are disposed in a staggered manner along the height direction to reduce a gap between the first distribution layer and the second distribution layer along a horizontal direction. Thus, the size limitation problem of an existing redistribution process is overcome, the redistribution density can be improved, and the risk of short circuit is reduced.

DETAILED DESCRIPTION

The present invention will be described in detail below with reference to embodiments shown in the accompanying drawings. However, these embodiments are not intended to limit the present invention, and changes of structures, methods or functions, made by an ordinary person skilled in the art according to these embodiments are all included within the scope of protection of the present invention.

Figure 1:
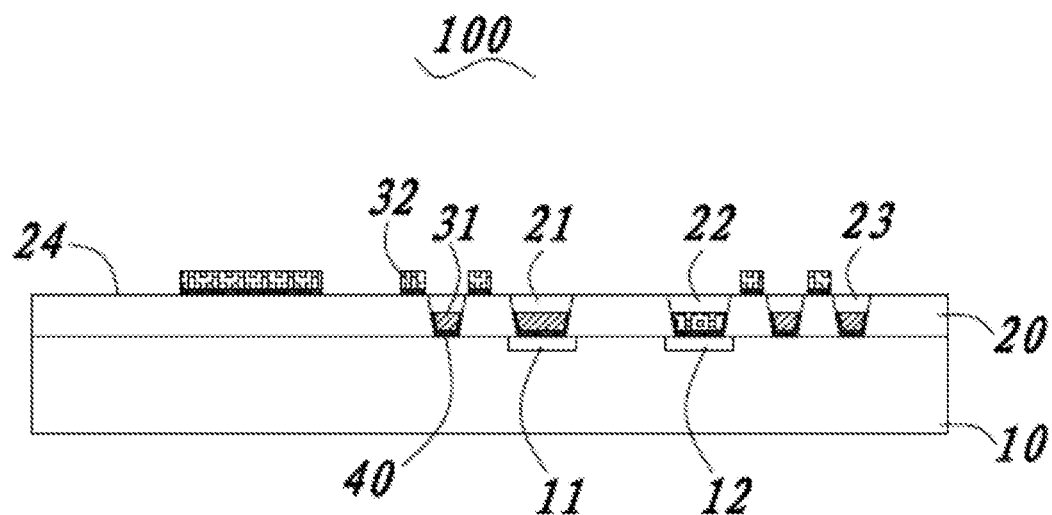
FIG. 1 is a schematic structural diagram of a chip redistribution structure according to the present invention.
Figure 2:
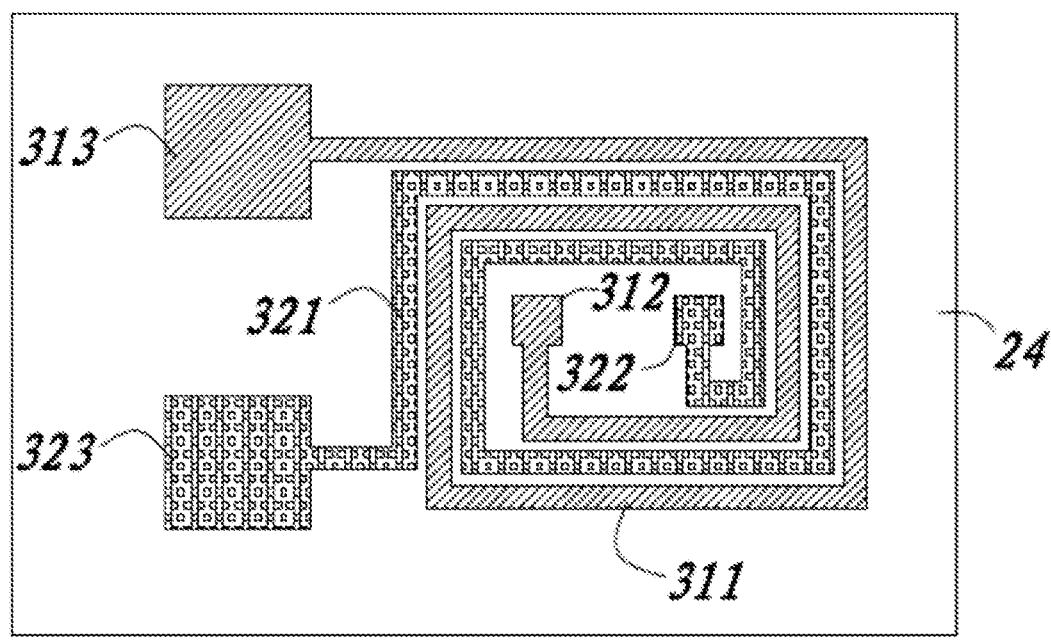
FIG. 2 is a schematic planar structural diagram of the chip redistribution structure according to the present invention.
Figure 3:
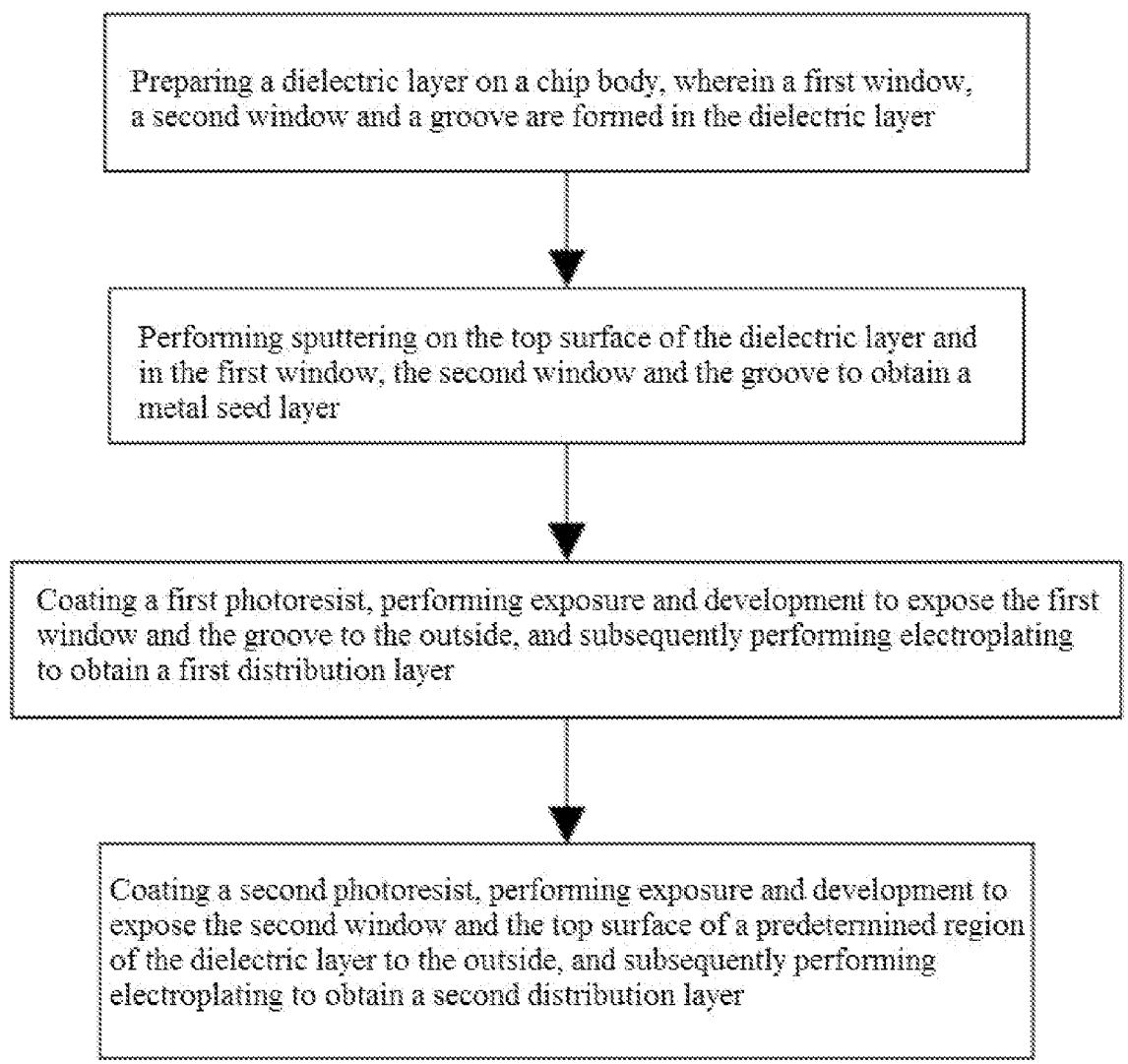
FIG. 3 is a main flowchart of a preparation method of the chip redistribution structure according to the present invention.
Figure 4:
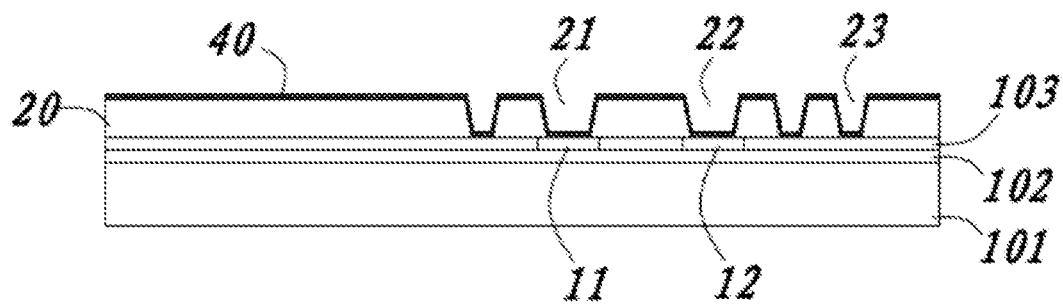
FIG. 4 is a schematic structural diagram when a metal seed layer in the chip redistribution structure according to the present invention is prepared.
Figure 5:
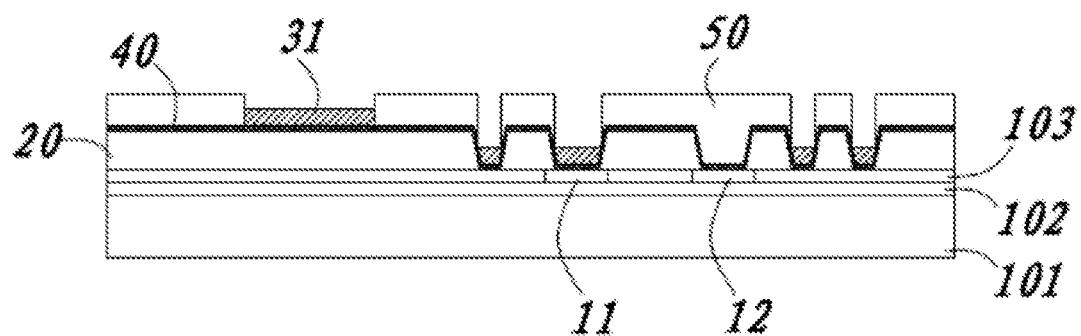
FIG. 5 is a schematic structural diagram when a first distribution layer in the chip redistribution structure according to the present invention is prepared.
Figure 6:
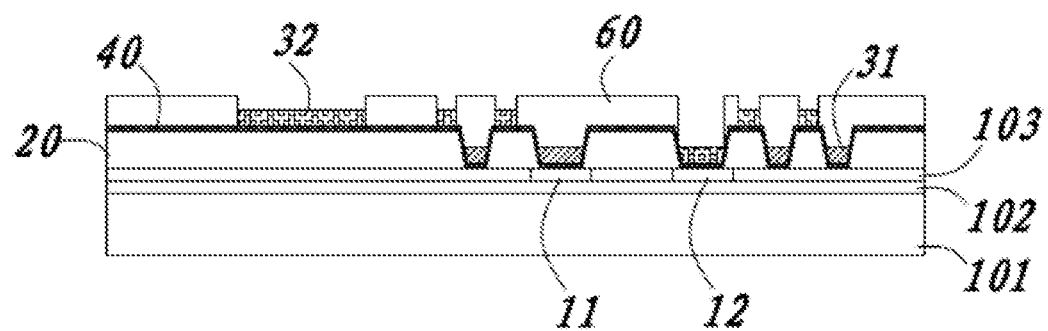
FIG. 6 is a schematic structural diagram when a second distribution layer in the chip redistribution structure according to the present invention is prepared.

As shown in FIGS. 1 and 2, the chip redistribution structure 100 according to the present invention includes a chip body 10, a dielectric layer 20 disposed on the chip body 10, and a first distribution layer 31 and a second distribution layer 32 which are connected to the chip body 10.

A first pin 11 and a second pin 12 are disposed on the surface of the chip body 10, and the dielectric layer 20 is recessed downwards to form a first window 21, a second window 22, and a groove 23 interconnected with the first window 21. The first window 21 and the second window 22 respectively correspond to the first pin 11 and the second pin 12. The first distribution layer 31 extends along the groove 23 and is interconnected with the first pin 11, and the second distribution layer 32 is disposed above the dielectric layer 20 and is interconnected with the second pin 12. Both the first distribution layer 31 and the second distribution layer 32 are made of the same material, preferably metal copper in general. Of course, according to actual product demands, the first distribution layer 31 and the second distribution layer 32 may also be prepared and shaped from different materials. Further, the first distribution layer 31 and the second distribution layer 32 may also be made of two or more different conductive materials. For example, the second distribution layer 32 is configured as a Cu/Ni/Au three-layer structure.

The dielectric layer 20 further has a top surface 24 extending substantially in the form of a plane along a horizontal direction. The first distribution layer 31 includes a first body portion 311 disposed in the groove 23, a first connecting portion 312 connected with the first body portion 311 and located in the first window 11, and a first cooperating portion 313 at the end, away from the first connecting portion 312, of the first body portion 311. The first body portion 311 preferably does not extend beyond the opening position of the groove 23. That is, the first body portion 311 does not extend beyond the top surface 24 of the dielectric layer 20 along the height direction. The second distribution layer 32 includes a second body portion 321 disposed on the top surface 24, a second connecting portion 322 connected with the second body portion 321 and located in the second window 12, and a second cooperating portion 323 at an end, away from the second connecting portion 322, of the second body portion 321. Here, the first cooperating portion 313 and the second cooperating portion 323 are disposed on the top surface 24 of the dielectric layer 20. The first cooperating portion 313 and the second cooperating portion 323 are configured for cooperation to prepare corresponding conductive bumps so as to implement subsequent encapsulation. The groove 23, the first body portion 311 and the second body portion 321 are respectively in a spiral shape, and the first body portion 311 and the second body portion 321 are in the form of a double helix, as shown in FIG. 2.

In this embodiment, the chip body 10 includes a semiconductor substrate 101, a line layer 102 formed on the surface of the semiconductor substrate 101, and a protective layer 103 covering the line layer 102. The first pin 11 and the second pin 12 are connected to the line layer 102. Obviously, the protective layer 103 has openings corresponding to the first pin 11 and the second pin 12, so that the line layer 102 can cooperate with and be connected with the outside.

The chip redistribution structure 100 further includes a metal seed layer 40, on which both the first distribution layer 31 and the second distribution layer 32 are disposed. Here, the first distribution layer 31 and the second distribution layer 32 are formed on the same metal seed layer 40, and after both the first distribution layer 31 and the second distribution layer 32 are prepared, the metal seed layer 40 in a region which is not covered by the first distribution layer 31 and the second distribution layer 32 is removed by etching. Thus, the process is simpler. The first distribution layer 31 and the second distribution layer 32 are disposed at an interval in the height direction, so that a gap between the first distribution layer 31 and the second distribution layer 32 in the horizontal direction can be further decreased, thereby breaking through the limitation of an existing process. In other words, the redistribution density on the surface of the chip body 10 can be improved, and the risk of short circuit between different distribution layers can be reduced.

It should be noted that the terms of description of directions, such as "horizontal direction", "vertical direction", and "height direction" in the foregoing are not a limitation on the preparation process and installation direction of the chip redistribution structure 100, but are merely for more clearly illustrating the structural position relationship of the chip redistribution structure 100.

In conjunction with FIGS. 3 to 6, the present application further provides a preparation method of the chip redistribution structure 100 described above. The method mainly includes:

providing a chip body 10, wherein a first pin 11 and a second pin 12 are disposed on the surface of the chip body 10;

preparing a dielectric layer 20 on the surface of the chip body 10, wherein the dielectric layer 20 is provided with a first window 21 corresponding to the first pin 11, a second window 22 corresponding to the second pin 12 and a groove 23 interconnected with the first window 21;

performing sputtering on the top surface 24 of the dielectric layer 20 and in the first window 21, the second window 22 and the groove 23 to obtain a metal seed layer 40;

coating a first photoresist 50 and performing exposure and development to expose the first window 21 and the groove 23 to the outside, so that a first distribution layer 31 is prepared in the first window 21 and the groove 23, wherein of course, the first distribution layer 31 further includes a first cooperating portion 313 extending to a predetermined position at the top surface 24; and coating a second photoresist 60 and performing exposure and development to expose the second window 22 and the top surface of a predetermined region of the dielectric layer 20 to the outside, so that a second distribution layer 32 is prepared in the second window 22 and on the top surface 24 exposed to the outside, wherein the second distribution layer 32 further includes a second cooperating portion 323 extending to another predetermined position at the top surface 24.

In addition, the dielectric layer 20 is mostly made of an insulating resin material. In the preparation process of the first window 21, the second window 22 and the groove 23, side walls thereof form angles inclined outward from bottom to top, thereby facilitating the preparation of the metal seed layer 40, the first distribution layer 31 and the second distribution layer 32, and the structural stability.

Both the first distribution layer 31 and the second distribution layer 32 are prepared with an electroplating process. The preparation method further includes: after the first distribution layer 31 is prepared, the photoresist 50 is removed; after the second distribution layer 32 is prepared, the second photoresist 60, and the metal seed layer 40 in a region which is not covered by the first distribution layer 31 and the second distribution layer 32 are removed.

Figure 7:
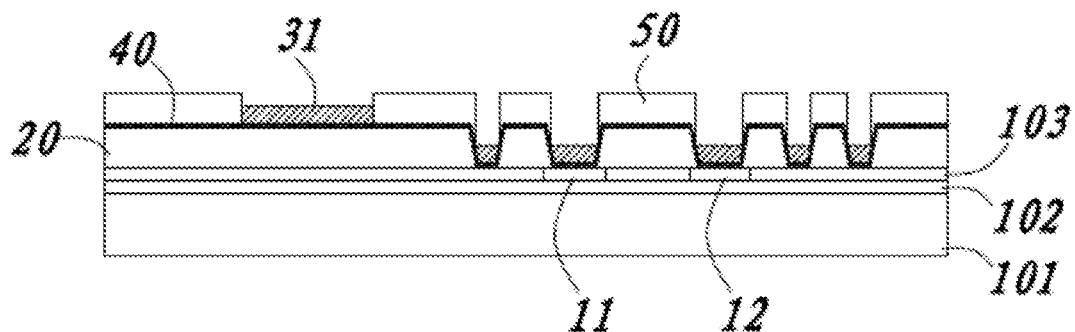
FIG. 7 is a schematic structural diagram when a first distribution layer in a preparation method of a chip redistribution structure according to another embodiment of the present invention is prepared.
Figure 8:
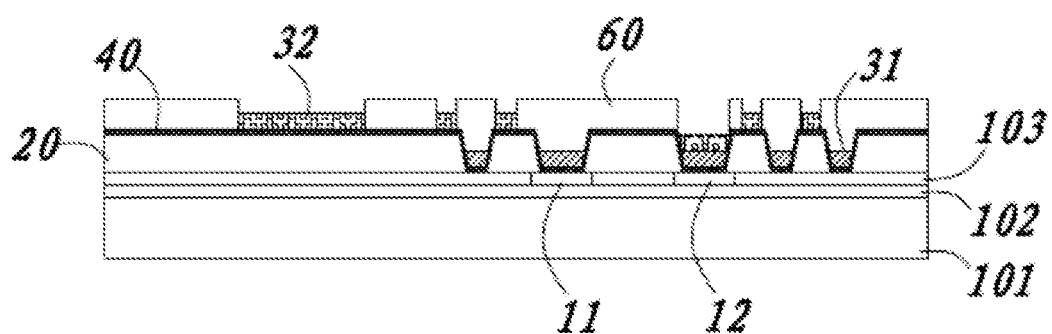
FIG. 8 is a schematic structural diagram when a second distribution layer in the preparation method of the chip redistribution structure according to the another embodiment of the present invention is prepared.

As shown in FIGS. 7 and 8, after the first photoresist 50 is coated, exposure and development are performed so that the second window 22, the first window 21 and the groove 23 are exposed to the outside. That is, while the first distribution layer 31 is prepared, electroplating is also performed on the second pin 12 of the second window 22 to obtain a layer of conductive material which is the same as the first distribution layer 31. In the subsequent preparation process of the second distribution layer 32, the height difference between the second body portion 321 and the second connecting portion 322 is reduced. The first distribution layer 31 and the second distribution layer 32 are preferably made of the same conductive material by electroplating.

In summary, in the chip redistribution structure and the preparation method thereof according to the present invention, the dielectric layer 20 is disposed on the chip body 10, the groove 23 is formed in the dielectric layer 20, and the first body portion 311 and the second body portion 321 are respectively disposed in the groove 23 and on the top surface 24 of the dielectric layer 20. Through staggered disposing in the height direction, the gap between the two distribution layers along the horizontal direction is reduced. Thus, the size limitation problem of an existing redistribution technology is overcome, the redistribution density can be improved, and the risk of short circuit is reduced.

It should be understood that although the Description is described according to the embodiments, not every embodiment includes only one independent technical solution. This presentation manner of the Description is only for clarity. A person skilled in the art should consider the Description as a whole, and technical solutions in all of the embodiments may also be properly combined to form other embodiments that will be understood by a person skilled in the art.

The above detailed description only aims to specifically illustrate the feasible embodiments of the present invention, and is not intended to limit the scope of protection of the present invention. Equivalent embodiments or modifications thereof made without departing from the spirit of the present invention shall fall within the scope of protection of the present invention.

What is claimed is:

1. A chip redistribution structure, comprising:
a chip body; and
a first distribution layer and a second distribution layer which are connected to the chip body;
wherein a first pin and a second pin are disposed on a surface of the chip body; and
wherein the chip redistribution structure further comprises a dielectric layer disposed on the surface of the chip body, the dielectric layer comprises a first surface attached to the surface of the chip body and a second surface facing away from the chip body; wherein the dielectric layer is recessed from the second surface toward the first surface to form a first window, a second window, and a groove interconnected with the first window, all of the first window, the second window and the groove are respectively recessed through the dielectric layer along a thickness direction of the dielectric layer;
the first window is configured to expose the first pin from the second surface, and the second window is configured to expose the second pin from the second surface;
the first distribution layer is disposed in and extends along the groove to reach the first window, and is disposed in the first window to be interconnected with the first pin, and the second distribution layer is disposed on the second surface of the dielectric layer and extends to be disposed in the second window and interconnected with the second pin;
wherein the first distribution layer comprises a first body portion disposed in the groove, and a first connecting portion connected with the first body portion and located in the first window, a top of the first body portion of the first distribution layer is spaced from an opening of the groove on the second surface,
wherein the second distribution layer comprises a second body portion disposed on the second surface of the dielectric layer, and a second connecting portion connected with the second body portion and located in the second window;
wherein, in a plan view, the first body portion and the second body portion each extend in a spiral shape, and the first body portion winds outwardly along the second body portion such that loops of the spiral shape of the first body portion alternate with loops of the spiral shape of the second body portion.

2. The chip redistribution structure according to claim 1, wherein the chip redistribution structure further comprising a metal seed layer, on which both the first distribution layer and the second distribution layer are disposed.

3. The chip redistribution structure according to claim 1, wherein a top of the second connecting portion of the second distribution layer is spaced from an opening of the second window on the second surface.

4. The chip redistribution structure according to claim 1, wherein the first distribution layer and the second distribution layer are made of the same material.

5. The chip redistribution structure according to claim 1, wherein the chip body comprises a semiconductor substrate, a line layer formed on a surface of the semiconductor substrate, and a protective layer covering the line layer; and the first pin and the second pin are connected to the line layer.

6. The chip redistribution structure according to claim 1, wherein the first connecting portion of the first distribution layer is spaced from an opening of the first window on the second surface.

7. The chip redistribution structure according to claim 1, wherein the first distribution layer comprises a first cooperating portion at an end of the spiral shape of the first body portion, away from the first connecting portion;
   the second distribution layer comprises a second cooperating portion at an end of the spiral shape of the second body portion, away from the second connecting portion; and
   the first cooperating portion and the second cooperating portion are disposed on the second surface of the dielectric layer.

8. The chip redistribution structure according to claim 7, wherein, in the plan view, the first connecting portion is positioned near a middle of the dielectric layer, the first cooperating portion is located near an edge of the dielectric layer, and the first body portion winds outwardly from the first connecting portion to the first cooperating portion; in the plan view, the second connecting portion is positioned near the middle of the dielectric layer, the second cooperating portion is located near the edge of the dielectric layer, and the second body portion winds outwardly from the second connecting portion to the second cooperating portion.

9. The chip redistribution structure according to claim 1, wherein sidewalls of the first window, sidewalls of the second window and sidewalls of the groove are formed with outwardly inclined angles from the first surface of the dielectric layer to the second surface of the dielectric layer.

10. The chip redistribution structure according to claim 1, wherein the first distribution layer and the second distribution layer are made of copper.

11. The chip redistribution structure according to claim 1, wherein the first distribution layer and the second distribution layer are made of different conductive materials.

12. The chip redistribution structure according to claim 11, wherein the first distribution layer is made of copper, and the second distribution layer is configured as a Cu/Ni/Au three-layer structure.

* * * * *